(12) United States Patent
Klingel

(10) Patent No.: US 9,597,697 B2
(45) Date of Patent: Mar. 21, 2017

(54) APPARATUS FOR THE COATING OF A SUBSTRATE

(76) Inventor: Wolfgang Klingel, Friolzheim (DE)

( * ) Notice: Subject to any disclaimer, the term of this patent is extended or adjusted under 35 U.S.C. 154(b) by 834 days.

(21) Appl. No.: 12/719,168

(22) Filed: Mar. 8, 2010

(65) Prior Publication Data

US 2010/0224121 A1  Sep. 9, 2010

(30) Foreign Application Priority Data

Mar. 9, 2009 (DE) .................. 10 2009 013 379

(51) Int. Cl.
| | |
|---|---|
| B05C 11/06 | (2006.01) |
| B05B 7/06 | (2006.01) |
| B05C 11/10 | (2006.01) |
| H05K 3/00 | (2006.01) |
| H05K 3/28 | (2006.01) |

(52) U.S. Cl.
CPC .......... *B05B 7/066* (2013.01); *B05C 11/1034* (2013.01); *H05K 3/0091* (2013.01); *H05K 3/28* (2013.01); *H05K 2201/0129* (2013.01); *H05K 2203/0126* (2013.01); *H05K 2203/081* (2013.01)

(58) Field of Classification Search
None
See application file for complete search history.

(56) References Cited

U.S. PATENT DOCUMENTS

| 3,814,628 | A | * | 6/1974 | Larkin | ............................ 427/115 |
| 3,936,000 | A | * | 2/1976 | Weyn | ............................ 239/288.5 |
| 5,782,410 | A | * | 7/1998 | Weston | ............................ 239/63 |
| 6,106,900 | A | * | 8/2000 | Innes et al. | .................... 427/358 |
| 6,132,809 | A | | 10/2000 | Hynes et al. | |
| 6,170,760 | B1 | | 1/2001 | Bievenue et al. | |
| 6,270,019 | B1 | | 8/2001 | Reighard | |
| 7,289,878 | B1 | * | 10/2007 | Estelle et al. | .................. 700/233 |
| 2002/0179737 | A1 | * | 12/2002 | Ryser | ............................ 239/418 |

(Continued)

FOREIGN PATENT DOCUMENTS

| DE | 33 29 880 A1 | 3/1984 |
| DE | 102 61 576 A1 | 7/2004 |

(Continued)

*Primary Examiner* — Charles Capozzi
(74) *Attorney, Agent, or Firm* — Harness, Dickey & Pierce, P.L.C.

(57) ABSTRACT

The invention relates to an apparatus for the coating of a substrate, in particular of a circuit board, with a material application device for applying a coating material and with a gas supplying device for the supply of a gaseous medium, the material application device having an inner tubular element, the gas supply device having an outer tubular element which is arranged coaxially to the inner tubular element and surrounds the latter, so as to form between the outer and the inner tubular element a gas supply duct which has an annular orifice at one end, the supply duct being configured so that the gaseous medium flows out, parallel to the coating material, through the annular orifice, in order, when it impinges on the substrate, to displace the applied coating material and thereby distribute it over the area. The apparatus is distinguished in that the material application device has a jet valve which, in a first operating mode, carries out a jetted supply of material into the inner tubular element.

15 Claims, 1 Drawing Sheet

(56) References Cited

U.S. PATENT DOCUMENTS

2004/0221805 A1* 11/2004 Klingel .................... 118/323
2005/0095366 A1* 5/2005 Fang et al. ............... 427/421.1
2007/0154647 A1 7/2007 Klingel
2007/0199824 A1* 8/2007 Hoerr et al. ................ 205/80
2008/0164335 A1 7/2008 Quinones et al.

FOREIGN PATENT DOCUMENTS

DE 20 2004 009 389 U1 9/2004
EP 1 057 542 A2 12/2000

* cited by examiner

APPARATUS FOR THE COATING OF A SUBSTRATE

CROSS REFERENCES TO RELATED APPLICATIONS

This application claims priority of German patent application DE 10 2009 013 379.8 filed on Mar. 9, 2009.

BACKGROUND OF THE INVENTION

The present invention relates to an apparatus for the coating of a substrate, in particular a circuit board with a device (material application device) for applying a coating material, in particular a protective lacquer, and with a device for supplying a gaseous medium (gas supply device), the material application device having an inner tubular element, the gas supply device having an outer tubular element which is arranged coaxially to the inner tubular element and surrounds the latter, so as to form, between the outer and the inner tubular element, a gas supply duct which has an annular orifice at one end, the supply duct being configured so that the gaseous medium flows out, parallel to the coating material, through the annular orifice, in order, when it impinges on the substrate, to displace the applied coating material and thereby to distribute it over the area.

An apparatus of the abovementioned type is known from the publication DE 10261576 A1.

In general, apparatuses of this type are used, for example, for providing circuit boards with a protective lacquer. An appreciable problem in the coating of circuit boards with a protective lacquer is, in particular, that of applying the protective lacquer accurately. Minor deviations or splashes of protective lacquer may lead very quickly to a contamination of contacts, this being reflected later in operating faults of the circuit.

In general, spraying methods, as they are known, are often used, which, by means of spraying nozzles of differing shape, atomize lacquer when it leaves a nozzle. Air-assisted atomization of the lacquer gives rise to a lacquer film closed in the middle and becoming depleted outwardly, with a spray mist and splashes thereby being formed. This spraying method is suitable particularly for manual spraying by means of paint spray guns because of the transitions which run away into one another. A broad overlapping of the spray passes is a precondition for a uniform spray pattern, and therefore no sharply delimiting lacquering edge can be formed.

A lacquering pattern with an exact delimitation of the lacquering surface and with less of a spray mist is obtained by means of what are known as airless spray systems. Since these require exact reproducible spraying, the spray valves used are guided by means of robot systems. The overlapping of the spray passes should in this case be as low as possible, in order to avoid accumulations of material. Various spray valves and designs are known in the prior art.

A known method for applying a protective lacquer is known by the name of "Select-Coat® method" and is based on a slotted nozzle. The protective lacquer is pressed through this nozzle. However, the least impurities cause disruption in maintaining the lacquer film. Substrates with higher obstacles, such as are presented, for example, by a printed circuit board module, cannot be coated satisfactorily, because spray shadows are formed behind each passed-over obstacle as a function of the speed and the component height. Splashes also occur under these conditions. The viscosity of the lacquers should not exceed 200 mPas. The formation of splashes otherwise increases.

For higher-viscosity coating materials, there is a method which is called the "Swirl-Coat method" and is based on a spray jet moved circularly or elliptically. This method is well suited to low-populated surfaces in the case of printed circuit board modules, whereas widely differing layer thicknesses occur in the case of surfaces populated with higher components. The application width of the spray surface also changes with the unavoidably necessary change in the distance of the nozzle from the substrate. This method is not suitable for applying low-viscosity substances and lacquers to printed circuit board modules, because excessive differences arise in the lacquer height. The spray head cannot penetrate between high components because of its size.

Furthermore, during lacquering, filaments remain caught on components and interrupt the lacquering pattern, thereby generating splashes. Moreover, marginal regions cannot be coated cleanly by means of this method.

DE 33 29 880 A1 discloses a spray valve which has a material nozzle, which distributes the material at the nozzle outlet, and air nozzles which guide the generated material stream of finely distributed droplets. According to the guidance of the air stream, round or elliptical coating surface areas arise, from which coating tracks are formed. The spray head cannot penetrate between high components because of its size. With the increasing distance which results from this, the spray jet broadens and generates splashes.

U.S. Pat. No. 6,170,760 B1 discloses an apparatus in which the air is routed in the form of a jacket around a coating material in the material nozzle. The lacquer is atomized when it leaves the spray valve. The nozzle may be of slender design, but cannot have an arbitrary length, because the pulsation effect belonging to this method is otherwise reinforced. Too slender a nozzle (<0.6 mm) also reinforces the pulsation and generates splashes. The pulsation arises because the coating material endeavors to assume the spherical shape which it assumes in the air stream as a function of the speed, nozzle diameter and viscosity of the coating material. The air which expands when it emerges from the nozzle generates splashes if the nozzle is too thin. Consequently, a narrow coating surface cannot be generated, but, instead, tracks with a width of only approximately 20 mm. Only low-viscosity lacquers can be processed. In the case of higher-viscosity materials, the pulsation increases, with the result that splashes occur, because both air and accumulations of substance are formed in the spray nozzle and lead to an irregular discharge of material.

U.S. Pat. No. 6,132,809 A discloses a rotatable double head which is equipped with a dispensing and a spray head.

Although the apparatus disclosed in DE 10261576 and mentioned initially has proved appropriate in practice, there still remains the wish to achieve improved application, higher flexibility and an improved coating of marginal contours with as low an outlay as possible in structural terms.

SUMMARY OF THE INVENTION

The object of the present invention, then, is to specify an apparatus which does not have the disadvantages of the prior art. The apparatus is to allow a high-precision coating of, in particular, marginal contours and, moreover, to permit coating in which no splashes occur, the processing of high-viscosity and low-viscosity lacquers being possible without a change of nozzle. Moreover, a distribution of the coating material, for example, behind small legs of components on a circuit board is also to be possible.

The object on which the invention is based is achieved by an apparatus of the type initially mentioned, in that the material application device has a jet valve which, in a first operating mode, allows a jetted supply of material into the inner tubular element.

By a jet valve being used, a highly accurate metering of the coating material and high-precision point-accurate application are possible, the size of the material drops discharged being adjustable by program control. It is precisely the coating of marginal contours which is markedly improved by this apparatus since, for example, no curtailment of the bead at corners occurs. Specifically, the material drops form a bead only on the substrate. The structural outlay can be understood clearly, since only one valve has to be provided for this purpose, which, furthermore, is also suitable for other types of application, such as, for example, dispensing.

Moreover, the apparatus applies the coating material to the substrate without the supply of air, that is to say with no misting, this application only here being distributed uniformly on the substrate as a result of the corresponding supply of a gaseous medium, in particular compressed air. The distribution of the coating material therefore takes place uniformly, since the air flows in an annular supply duct which surrounds the stream of coating material.

This configuration readily makes it possible for the inner tubular element to have any desired length, meaning that coating can be carried out, even between higher components, at a very short distance from the substrate. It is consequently possible to coat virtually without splashes.

The layer thickness and track width themselves arise from the material quantity, the material viscosity and the intensity of the air supplied (displacer air). During the displacement of the material drops or of the material bead which is initially formed when the coating material is being applied, a material bulge occurs, which, for example, coats small component legs on a circuit board by wrapping around them and reaches even small component legs and components lying in the spray shadow.

As already mentioned, very short distances between the substrate and inner tubular element can be implemented. This distance preferably amounts to 6-10 mm. Since application from such a distance is virtually free of splashes, contacts, such as plugs, switches, etc., consequently remain reliably free of splashes. The formation of abbreviated round edges at corners due to the trailing of the bead is minimized by the jetting of individual drops, this being assisted by the displacer air jet which virtually eliminates this trailing.

When, for example, lower components, such as SMD components, are being coated, the bulge which is generated by the displacer air is pushed over these components, completely encases these and ends in the from of a sharp coating surface delimitation which is uneven according to the additional material requirement, but is mist-free and splash-free.

The apparatus is suitable for coating with any flowable coating material which can be applied to the substrate from the inner tubular element. It is suitable even for high-viscosity substances, by means of which higher layer thicknesses can be generated. The pressure of the displacer air is increased in proportion to a rise in viscosity.

The apparatus according to the invention consequently makes it possible to apply a coating material (designated as spraying) both as a material bead (designated as dispensing) or as a material drop (designated as jetting), and in both instances the material can in each case be distributed selectively by the use of air.

An apparatus having this wide range of use and having this flexibility has not been obtainable hitherto on the market.

In a preferred development, at least three, preferably four or more indentations are provided in the outer tubular element and extend radially inward as far as the inner tubular element.

The advantage of this configuration is that the inner tubular element can be centered with respect to the outer element in a structurally simple way, this centered position being held permanently. Furthermore, these indentations act as air-routing elements in order to achieve a laminar flow. A specific structural element requiring markedly more construction space has hitherto been necessary for this purpose.

That is to say, the outside diameter of the outer tubular element can also be reduced, preferably to 2 to 2.5 mm. Consequently, even very confined spaces on a circuit board can be moved up to and coated cleanly.

In a preferred development, the inner tubular element possesses an end portion of identical diameter which faces the substrate.

That is to say, in other words, the end portion does not taper, as is provided in the prior art for forming a nozzle. Preferably, the end portion of the outer tubular element possesses a diameter of about 2 to 5 mm, preferably of 2.5 mm, and the end portion of the inner tubular element possesses a diameter of up to approximately 0.8 mm.

The advantage of this measure is that the two tubular elements can penetrate very easily even between components on a circuit board which stand very close to one another.

It is also conceivable, however, to design the end portion of the inner tubular element conically, so that the inside diameter decreases toward the orifice. The jet effect can thereby be reinforced.

In a preferred development, a device for heating the coating material is provided, in order to ensure a constant material flow.

In a preferred development, a heating device for heating the gaseous medium is provided, the heated medium, on its way through the outer tubular element, heating the coating material in the inner tubular element.

The advantage of this measure is that the viscosity of the coating material already previously heated can also be kept constant in the inner tube, in that corresponding heat is supplied to this coating material. A reproducible lacquer pattern can consequently be achieved.

In a preferred development, a device for melting the coating material is provided, in order to coat melt lacquers which cure as a result of cooling. The device may use, for example, hot air (180°) for melting.

In a preferred development, the outer tubular element is assigned a valve in order to interrupt the stream of gaseous medium through the element.

This measure has the effect that a thick covering in the form of a material bead can be achieved, in that the displacer air is switched off, that is to say interrupted. Consequently, regions such as, for example, rows of small legs of ICs, etc., can be especially protected by means of one and the same version (of the inner and outer tubes).

In a preferred development, for controlling the displacer air, a valve, preferably a proportional valve, is provided, which varies the air pressure by process control.

In a preferred development, the gas supply device has an admixing unit in order to admix a pulverulent material to the gaseous medium.

The advantage of this is that the properties of the coating material can be varied.

The apparatus according to the invention carries out a method which has the following steps:

application of the coating material to the substrate in such a way that a bead or a material drop is formed, and action upon the bead or the material drop with a jet of a gaseous medium, so that the bead or the material drop is displaced and distributed over the area.

This method leads to the advantages already mentioned, and there is therefore no need to repeat these.

Preferably, the gaseous medium is routed coaxially with respect to the coating material. The gaseous medium may be, for example, an inert gas, the advantage of this being that an undesirable drying of the coating material on the inner tubular element is prevented.

Further advantages and refinements of the invention may be gathered from the description and the accompanying drawing.

It will be appreciated that the features mentioned above and those yet to be explained below can be used not only in the combinations specified in each case, but also in other combinations or alone, without departing from the scope of the present invention.

BRIEF DESCRIPTION OF THE DRAWINGS

The invention is now explained in more detail by means of an exemplary embodiment, with reference to the drawing in which.

DETAILED DESCRIPTION OF PREFERRED EMBODIMENTS

Figures 1, 2:
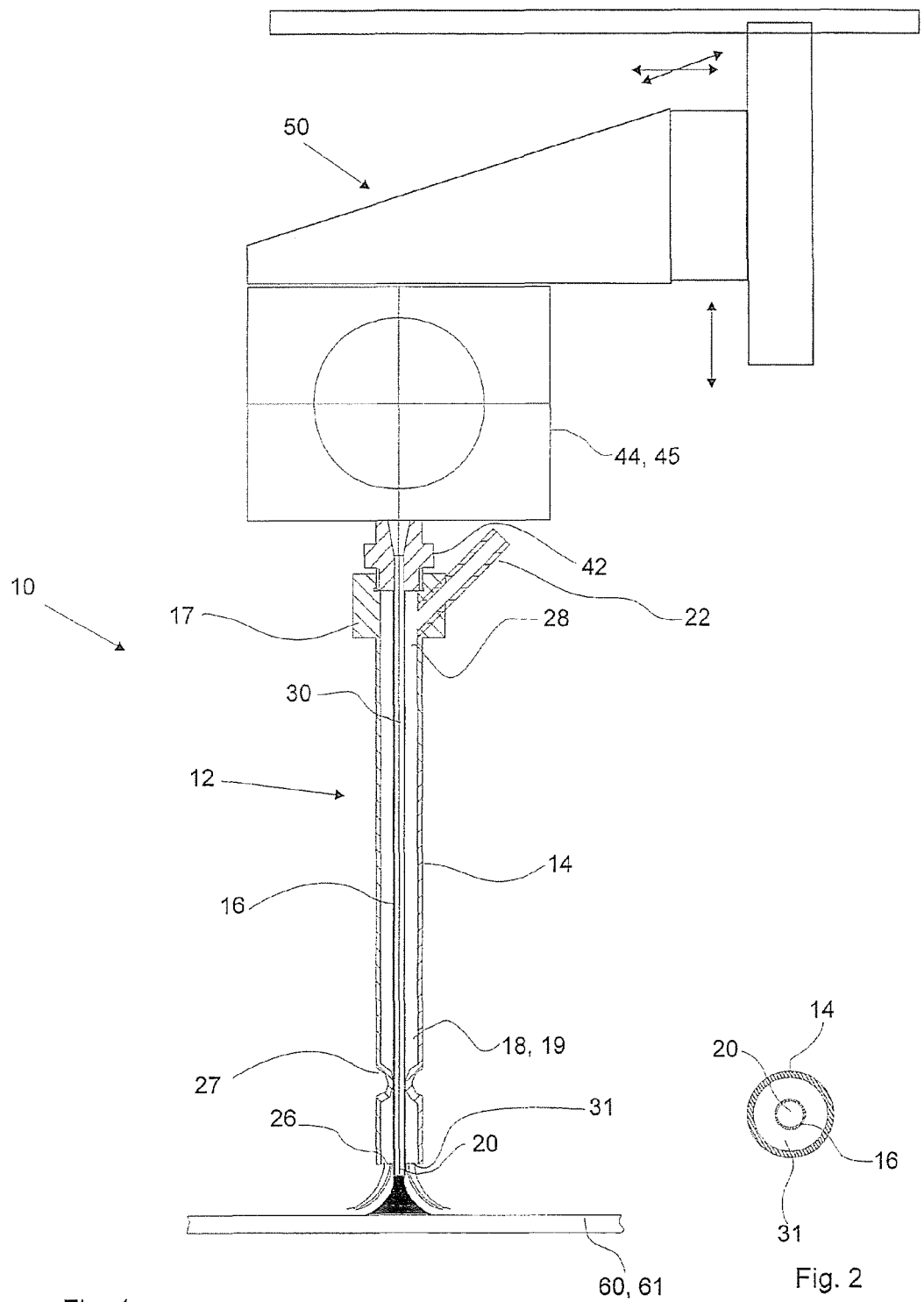
FIG. 1 shows a diagrammatic illustration of an apparatus for the coating of a substrate, as illustrated in a side view.
FIG. 2 shows a sectional view of the lower end of the tubular elements.

In FIG. 1, the nozzle region (coating head) of a coating plant is illustrated and is designated by reference symbol 10. A coating plant is used, for example, for applying a protective lacquer to a circuit board in order to protect the conductor tracks, for example, against moisture.

The coating plant comprises a nozzle device 12 which is constructed essentially from two tubes 14, 16 which terminate in each case at one end 28 in a head part 17, 42. The tube 14 lies on the outside (called the outer tube below) and surrounds the inner tube 16. The two tubes 14, 16 are arranged coaxially to one another, so that an annular region 18 is formed between the inner tube 16 and the outer tube 14. The mechanical connection of the two tubes 14, 16 may take place, for example, by the two head parts 17, 42 being screwed together.

As may be gathered from FIG. 1, the inner tube 16 terminates, offset with respect to the outer tube 14, so that a projecting end portion 20 is obtained.

Indentations 27 are provided on the outer tube 14 in its lower region and extend radially inward in the direction of the inner tube 16. The indentations, on the one hand, serve for holding the inner tube centrically with respect to the outer tube. In order to achieve this reliably, preferably three or more indentations are provided which are distributed uniformly over the circumference.

On the other hand, these indentations 27 serve as air-routing elements, in order to make the flow of the gaseous medium to the open end 26 of the annular duct laminar, that is to say free of vortices.

A tubular feed 22 is attached to the head part 17 of the outer tube 14 and issues into the annular region 18. A gaseous medium can be conducted into the annular region 18 via this feed 22. Inside this annular region 18, which forms an annular duct 19, a flow element may be arranged which makes the flow of the gaseous medium laminar. Preferably, however, such a flow element is omitted, since the indentations 27 can fulfill this function. That end 28 of the annular duct 19 which lies opposite the open end 26 is closed, so that the gaseous medium cannot emerge at this point. Although the open end 26 of the outer tube 14 possesses the same diameter as the annular duct in the figure, it is also conceivable to reduce the diameter in order thereby to cause the outflowing air to flow more closely against the inner tube.

The inner tube 16 likewise forms a duct 30 which extends coaxially with respect to the annular duct 19 and which is likewise open at the end portion 20. Consequently, two orifices are obtained at the end portion 20, to be precise a circular orifice of the inner tube 16, out of which the coating material can emerge, and an annular orifice 31, which lies coaxially and symmetrically (concentrically) to the circular orifice and out of which the gaseous medium can emerge. This is also illustrated diagrammatically in FIG. 2.

At the opposite end of the inner tube 16, the head part 42 is provided which is connected to the material supply in the form of a valve device 44. This valve device 44 comprises a jet valve 45. Such a jet valve allows the intermittent supply of material in very small quantities, so that a discharge of small material drops can take place in rapid sequence. Furthermore, the head part 42 is plugged or screwed into the head part 17 of the outer tube 14. The valve device 44 and, in particular, the jet valve 45 are intended for controlling the supply of a coating material into the duct 30. The gaseous medium supplied via the feed 22 is also controlled via a valve, not illustrated.

The nozzle device 12 is attached to a drive 50 which is indicated merely diagrammatically in the figure and allows a movement of the nozzle device 12 in a plurality of dimensions. The arrows shown in the figure indicate the directions of movement. In addition to these translational movements, pivoting movements are also possible.

The application of a coating material to a substrate 60, for example a circuit board 61, can then be carried out as follows:

The coating material, for example a protective lacquer, is routed out of a reservoir which is under air pressure or by means of a program-controlled pump, which are not illustrated in the figure, via the jet valve 45 into the duct 30 of the inner tube 16. The coating material emerges in the form of a jet or in the form of drops at the end portion 20 and forms a bead on the circuit board 61 when the nozzle device 12 moves in relation to the circuit board 61. In order to distribute this bead on the circuit board 61 over its area, air or an inert gas is introduced into the feed 22, flows through the annular duct 19 and emerges at the open end 26 of the outer tube 14. On account of the coaxial arrangement of the two tubes 14, 16, the air flows parallel to the coating material jet and displaces the coating material when it impinges onto the circuit board 61. By means of an appropriate setting of the material pressure, air pressure and air quantity, the nature of the displacement on the circuit board 61 can be set.

The supply of air may be interrupted via the shut-off valve if it is necessary to apply (dispense) a thicker material layer on the circuit board 61.

The interruption of the material stream through the duct 30 must take place such that pressure is no longer exerted on the material located in the duct, in order thereby to prevent dripping. This is brought about by the leaktight closure of the jet valve 45.

In addition to loading the duct 30 with coating material via a reservoir which is under pressure, it is also conceivable to arrange a metering pump which routes coating material out of the reservoir into the duct 30. The metering pump may be controlled in proportion to the speed of the drive.

On account of the small dimensions of the nozzle device 12, the outside diameter of the outer tube amounting, for example, only to 2 to 5 mm, preferably to 2.5 mm, the end portion 20 of the inner tube 16, even when components on the circuit board 61 are arranged closely next to one another, can move up very near to these or move through between these, for example at a distance from the circuit board of 6 to 10 mm. Splashes can therefore be avoided very effectively.

Furthermore, the tubes forming the ducts are simple structural elements, and therefore a cost-effective implementation of the nozzle device 12 becomes possible.

What is claimed is:

1. An apparatus for coating a substrate, in particular a circuit board, comprising a spray device having a material application device for applying a coating material and a gas supplying device for supplying a gaseous medium, the material application device having an inner tubular element having an inlet end for receiving said coating material and an outlet end opposite said inlet end for dispensing the coating material on the substrate, the gas supplying device having an outer tubular element which is arranged coaxially to the inner tubular element and surrounds the inner tubular element, so as to form, between the outer and the inner tubular elements, a gas supply duct which has an annular orifice at a lower end of the outer tubular element, the gas supply duct being configured so that the gaseous medium flows out, parallel to the coating material, through the annular orifice, in order, when it impinges on the substrate, to displace the applied coating material and thereby distribute it over an area of the substrate, wherein the apparatus further comprises a jet valve disposed at said inlet end of said inner tubular element of said spray device, said jet valve being connected to a source of the coating material and outputting a discontinuous flow of the coating material in discrete droplet form into the inlet end of the inner tubular element.

2. The apparatus as claimed in claim 1, wherein the outer tubular element has at least three indentations which extend radially inward as far as the inner tubular element.

3. The apparatus as claimed in claim 1, wherein the inner tubular element possesses a lower end portion of identical diameter which faces the substrate.

4. The apparatus as claimed in claim 1, wherein the outlet end of the inner tubular element faces the substrate and has a diameter which tapers.

5. The apparatus as claimed in claim 1, wherein an outlet end portion of the outer tubular element has a diameter of 2 to 5 mm.

6. The apparatus as claimed in claim 1, wherein the gas supply device has an admixing unit in order to admix a pulverulent material to the gaseous medium.

7. The apparatus as claimed in claim 1, wherein the apparatus includes a drive unit movable along at least two orthogonal axes.

8. The apparatus as claimed in claim 7, wherein said drive unit is pivotable.

9. The apparatus as claimed in claim 1, further including a means for heating the coating material before it is supplied into the inner tubular element.

10. The apparatus as claimed in claim 9, wherein a heating device for heating the gaseous medium is provided, the heated gaseous medium, on its way through the outer tubular element, preventing the heated coating material in the inner tubular element from cooling.

11. The apparatus as claimed in claim 9, wherein the coating material is a melted thermoplastic material.

12. The apparatus as claimed in claim 1, wherein the gas supply duct is configured so that the coating material is applied in a liquid non-atomized state directly onto the substrate.

13. An apparatus for coating a substrate, in particular a circuit board, comprising a spray device having a material application device for applying a coating material, and a gas supplying device for supplying a gaseous medium, the material application device having an inner tubular element having an inlet end for receiving said coating material and an outlet end opposite said inlet end for dispensing the coating material on the substrate, the gas supplying device having an outer tubular element which is arranged coaxially to the inner tubular element and surrounds the inner tubular element, so as to form, between the outer and the inner tubular elements, a gas supply duct which has an annular orifice at a lower end of the outer tubular element, the gas supply duct being configured so that the gaseous medium flows out, parallel to the coating material, through the annular orifice without atomizing the coating material, in order, when it impinges on the substrate, to displace the coating material, which is applied in a liquid state directly onto the substrate, and thereby distribute it over an area of the substrate, wherein the apparatus further comprises a jet valve disposed at said inlet end of said inner tubular element of said spray device, said jet valve being connected to a source of the coating material and outputting a discontinuous flow of the coating material in discrete droplet form into the inlet end of the inner tubular element.

14. The apparatus as claimed in claim 1, wherein the size of the droplets of material discharged by the jet valve are adjustably controlled.

15. The apparatus as claimed in claim 13, wherein the size of the droplets of material discharged by the jet valve are adjustably controlled.

* * * * *